United States Patent
Chu (10) Patent No.: US 9,654,121 B1
(45) Date of Patent: May 16, 2017

(54) CALIBRATION METHOD AND APPARATUS FOR PHASE LOCKED LOOP CIRCUIT

(71) Applicant: Integrated Device Technology, Inc., San Jose, CA (US)

(72) Inventor: Min Chu, Milpitas, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/169,997

(22) Filed: Jun. 1, 2016

(51) Int. Cl.
*H03L 7/06* (2006.01)
*H03L 7/099* (2006.01)

(52) U.S. Cl.
CPC .................................. *H03L 7/0992* (2013.01)

(58) Field of Classification Search
CPC ......... H03L 7/0891; H03L 7/18; H03L 7/093; H03L 7/087; H03L 7/10
USPC .................................................. 327/147–161
See application file for complete search history.

(56) References Cited

U.S. PATENT DOCUMENTS

| | | | |
|---|---|---|---|
| 4,684,941 A | 8/1987 | Smith et al. |
| 4,862,485 A | 8/1989 | Guinea et al. |
| 5,663,105 A | 9/1997 | Sua et al. |
| 5,748,949 A | 5/1998 | Johnston et al. |
| 5,757,240 A | 5/1998 | Boerstler et al. |
| 5,848,355 A | 12/1998 | Rasor et al. |
| 5,903,195 A | 5/1999 | Lukes et al. |
| 6,219,797 B1 | 4/2001 | Liu et al. |
| 6,259,327 B1 | 7/2001 | Balistreri et al. |
| 6,640,311 B1 | 10/2003 | Knowles |
| 6,643,787 B1 | 11/2003 | Zerbe et al. |
| 6,650,193 B2 | 11/2003 | Endo et al. |
| 6,683,506 B2 | 1/2004 | Ye et al. |

(Continued)

OTHER PUBLICATIONS

"19-Output PCIE Gen 3 Buffer", Si53019-A01A, Silicon Laboratories Inc., Rev. 1.1 May 2015, 34 Pages.

(Continued)

*Primary Examiner* — Quan Tra
(74) *Attorney, Agent, or Firm* — Kenneth Glass; William D. Davis; Glass & Associates (57) ABSTRACT

An integrated circuit apparatus for calibrating a phase locked loop (PLL) circuit that includes a phase comparator configured to receive a reference clock signal and a feedback clock signal and generate a phase error signal, a variable frequency oscillator configured for receiving the phase error signal and generating a corresponding fast clock signal at an output of the variable frequency oscillator, and a divider that is configured to divide the fast clock signal by a divisor (N) so as to generate the feedback clock signal, includes a calibration circuit. The calibration circuit is coupled to receive the reference clock signal and the fast clock signal and to provide a frequency band selection signal to the variable frequency oscillator. The calibration circuit includes a counting circuit for counting a number of cycles of the fast clock signal over a period of time defined by a number of cycles (M) of the reference clock signal. The calibration circuit also includes a selection block for performing a convergence test using the counted number of fast clock cycles, N, and M. The selection block generates the frequency band selection signal in accordance with the results of the convergence test to select a next candidate calibrated frequency band.

21 Claims, 6 Drawing Sheets

(56) References Cited

U.S. PATENT DOCUMENTS

| | | | |
|---|---|---|---|
| 6,727,767 B2 | 4/2004 | Takada | |
| 6,768,387 B1 | 7/2004 | Masuda et al. | |
| 6,870,411 B2* | 3/2005 | Shibahara | H03L 7/0891 |
| | | | 327/156 |
| 6,959,066 B2 | 10/2005 | Wang et al. | |
| 7,012,476 B2 | 3/2006 | Ogiso | |
| 7,323,916 B1 | 1/2008 | Sidiropoulos et al. | |
| 7,405,594 B1 | 7/2008 | Xu | |
| 7,434,083 B1 | 10/2008 | Wilson | |
| 7,541,848 B1 | 6/2009 | Masuda | |
| 7,545,188 B1 | 6/2009 | Xu et al. | |
| 7,573,303 B1 | 8/2009 | Chi et al. | |
| 7,586,347 B1 | 9/2009 | Ren et al. | |
| 7,590,163 B1 | 9/2009 | Miller et al. | |
| 7,671,635 B2 | 3/2010 | Fan et al. | |
| 7,737,739 B1 | 6/2010 | Bi | |
| 7,741,981 B1 | 6/2010 | Wan et al. | |
| 7,750,618 B1 | 7/2010 | Fang et al. | |
| 7,786,763 B1 | 8/2010 | Bal et al. | |
| 7,800,422 B2 | 9/2010 | Lee et al. | |
| 7,816,959 B1 | 10/2010 | Isik | |
| 7,907,625 B1 | 3/2011 | MacAdam | |
| 7,928,880 B2 | 4/2011 | Tsukamoto | |
| 7,941,723 B1 | 5/2011 | Lien et al. | |
| 8,010,072 B1 | 8/2011 | Nathawad | |
| 8,018,289 B1 | 9/2011 | Hu et al. | |
| 8,164,367 B1 | 4/2012 | Bal et al. | |
| 8,179,952 B2 | 5/2012 | Thurston et al. | |
| 8,188,796 B2 | 5/2012 | Zhu et al. | |
| 8,259,888 B2 | 9/2012 | Hua et al. | |
| 8,284,816 B1 | 10/2012 | Clementi | |
| 8,305,154 B1 | 11/2012 | Kubena et al. | |
| 8,416,107 B1 | 4/2013 | Wan et al. | |
| 8,432,231 B2 | 4/2013 | Nelson et al. | |
| 8,436,677 B2 | 5/2013 | Kull et al. | |
| 8,456,155 B2 | 6/2013 | Tamura et al. | |
| 8,471,751 B2 | 6/2013 | Wang | |
| 8,537,952 B1 | 9/2013 | Arora | |
| 8,693,557 B1 | 4/2014 | Zhang et al. | |
| 8,704,564 B2 | 4/2014 | Hasegawa et al. | |
| 8,723,573 B1 | 5/2014 | Wang et al. | |
| 8,791,763 B2 | 7/2014 | Taghivand | |
| 8,896,476 B2 | 11/2014 | Harpe | |
| 8,933,830 B1 | 1/2015 | Jeon | |
| 8,981,858 B1 | 3/2015 | Grivna et al. | |
| 9,077,386 B1 | 7/2015 | Holden et al. | |
| 9,100,232 B1 | 8/2015 | Hormati et al. | |
| 9,455,854 B2* | 9/2016 | Gao | H04B 1/16 |
| | | | 375/376 |
| 2002/0079937 A1 | 6/2002 | Xanthopoulos | |
| 2002/0191727 A1 | 12/2002 | Staszewski et al. | |
| 2003/0042985 A1 | 3/2003 | Shibahara et al. | |
| 2003/0184350 A1 | 10/2003 | Wang et al. | |
| 2004/0136440 A1 | 7/2004 | Miyata et al. | |
| 2004/0165691 A1 | 8/2004 | Rana | |
| 2005/0170787 A1 | 8/2005 | Yamamoto et al. | |
| 2006/0103436 A1 | 5/2006 | Saitou et al. | |
| 2006/0119402 A1 | 6/2006 | Thomsen et al. | |
| 2006/0197614 A1 | 9/2006 | Roubadia et al. | |
| 2006/0290391 A1 | 12/2006 | Leung et al. | |
| 2007/0149144 A1 | 6/2007 | Beyer et al. | |
| 2007/0247248 A1 | 10/2007 | Kobayashi et al. | |
| 2008/0043893 A1 | 2/2008 | Nagaraj et al. | |
| 2008/0104435 A1 | 5/2008 | Pernia et al. | |
| 2008/0129351 A1 | 6/2008 | Chawla | |
| 2008/0246546 A1 | 10/2008 | Ha et al. | |
| 2009/0083567 A1 | 3/2009 | Kim et al. | |
| 2009/0140896 A1 | 6/2009 | Adduci et al. | |
| 2009/0153252 A1* | 6/2009 | Chen | H03L 7/0891 |
| | | | 331/10 |
| 2009/0184857 A1 | 7/2009 | Furuta et al. | |
| 2009/0231901 A1 | 9/2009 | Kim | |
| 2009/0256601 A1 | 10/2009 | Zhang et al. | |
| 2009/0262567 A1 | 10/2009 | Shin et al. | |
| 2010/0007427 A1 | 1/2010 | Tomita et al. | |
| 2010/0052798 A1 | 3/2010 | Hirai | |
| 2010/0090731 A1 | 4/2010 | Casagrande | |
| 2010/0109714 A1 | 5/2010 | Lindfors et al. | |
| 2010/0164761 A1 | 7/2010 | Wan et al. | |
| 2010/0194483 A1 | 8/2010 | Storaska et al. | |
| 2010/0240323 A1 | 9/2010 | Qiao et al. | |
| 2010/0323643 A1 | 12/2010 | Ridgers | |
| 2011/0006936 A1 | 1/2011 | Lin et al. | |
| 2011/0032013 A1 | 2/2011 | Nelson et al. | |
| 2011/0095784 A1 | 4/2011 | Behel et al. | |
| 2011/0234204 A1 | 9/2011 | Tamura et al. | |
| 2011/0234433 A1 | 9/2011 | Aruga et al. | |
| 2011/0285575 A1 | 11/2011 | Landez et al. | |
| 2011/0304490 A1 | 12/2011 | Janakiraman | |
| 2012/0013406 A1 | 1/2012 | Zhu et al. | |
| 2012/0161829 A1 | 6/2012 | Fernald | |
| 2012/0200330 A1 | 8/2012 | Kawagoe et al. | |
| 2012/0249207 A1 | 10/2012 | Natsume et al. | |
| 2012/0262315 A1 | 10/2012 | Kapusta et al. | |
| 2012/0293221 A1 | 11/2012 | Ma et al. | |
| 2012/0297231 A1 | 11/2012 | Qawami et al. | |
| 2012/0317365 A1 | 12/2012 | Elhamias | |
| 2012/0328052 A1 | 12/2012 | Etemadi et al. | |
| 2013/0002467 A1 | 1/2013 | Wang | |
| 2013/0162454 A1 | 6/2013 | Lin | |
| 2013/0194115 A1 | 8/2013 | Wu et al. | |
| 2013/0211758 A1 | 8/2013 | Prathapan et al. | |
| 2013/0300455 A1 | 11/2013 | Thirugnanam et al. | |
| 2014/0021990 A1 | 1/2014 | Na et al. | |
| 2014/0029646 A1 | 1/2014 | Foxcroft et al. | |
| 2014/0210532 A1 | 7/2014 | Jenkins | |
| 2014/0327478 A1 | 11/2014 | Horng et al. | |
| 2014/0347941 A1 | 11/2014 | Jose et al. | |
| 2015/0028960 A1 | 1/2015 | Yorita | |
| 2015/0162921 A1 | 6/2015 | Chen et al. | |
| 2015/0180594 A1 | 6/2015 | Chakraborty et al. | |
| 2015/0200649 A1 | 7/2015 | Trager et al. | |
| 2015/0213873 A1 | 7/2015 | Joo et al. | |
| 2016/0013796 A1 | 1/2016 | Choi | |
| 2016/0084895 A1 | 3/2016 | Imhof | |
| 2016/0119118 A1 | 4/2016 | Shokrollahi | |
| 2016/0162426 A1 | 6/2016 | Benjamin et al. | |
| 2016/0211929 A1 | 7/2016 | Holden et al. | |

OTHER PUBLICATIONS

"NB3W1200L: 3.3 V 100/133 MHz Differential 1:12 Push-Pull Clock ZDB/Fanout Buffer for PCIe", ON Semiconductor, http://onsemi.com, Aug. 2013, Rev. 0, 26 Pages.

Texas Instruments "CDCEx913 Programmable 1-PLL VCXO Clock Synthesizer With 1.8-V, 2.5-V, and 13-V Outputs", Apr. 2015, pp. 1-36, pp. 11, 20-22.

Avramov, et al., "1.5-GHz Voltage Controlled Oscillator with 3% Tuning Bandwidth Using a Two-Pole DSBAR Filter", Ultrasonics, Ferroelectrics and Frequency Control. IEEE Transactions on. vol. 58., May 2011, pp. 916-923.

Hwang, et al., "A Digitally Controlled Phase-Locked Loop with a Digital Ohase-Frequency Detector for Fast Acquisition", IEEE Journal of Solid State Circuits, vol. 36, No. 10, Oct. 2001, pp. 1574-1581.

Kratyuk, et al., "Frequency Detector for Fast Frequency Lock of Digital PLLs", Electronic Letters, vol. 43, No. 1, Jan. 4, 2007, pp. 1-2.

Mansuri, "Fast Frequency Acquisition Phase-Frequency Detectors for GSamples/s Phase-Locked Loops", IEEE Journal of Solid-State Circuits, vol. 37 No. 10, Oct. 2002, pp. 1331-1334.

Nagaraju, "A Low Noise 1.5GHz VCO with a 175% Tuning Range Using Coupled FBAR's", IEEE International Ultrasonics Symposium (IUS), Oct. 2012, pp. 1-4.

Natanabe, "An All-Digital PLL for Frequency Multilication by 4 to 1022 with Seven-Cycle Lock Time", IEEE Journal of Solid-State Circuits, vol. 39 No. 2, Feb. 2003, pp. 198-204.

* cited by examiner

CALIBRATION METHOD AND APPARATUS FOR PHASE LOCKED LOOP CIRCUIT

BACKGROUND

Digital logic circuits often rely on clock signals for synchronization, derivation of reference signals, measuring phase differences, and other functions. The circuits may be segregated into different integrated circuits or different subsystems of a larger electronic device.

One approach for getting the clock signal to components is to distribute the clock signal from a centralized clock to every component requiring the clock signal. One disadvantage of this approach is that clock signals tend to have constraints that are difficult to maintain when the distribution is over a relatively large area or used to drive a relatively large number of components.

Another technique for distributing a clock signal entails distributing a reference clock signal to different components or even different regions within an integrated circuit. Each component or region has a local phase locked loop (PLL) or local delay locked loop (DLL) buffer to derive one or more local clock signals from the reference clock signal. Such designs are sometimes referred to as a "clock tree". The use of a tree structure allows clocked buffers to be configured for the specifics of the loads they are driving as well as limiting the load to be driven by any clock signal.

A PLL is "locked" when the PLL output clock frequency ($F_{OUT\_CLK}$) matches and tracks the frequency of the reference clock ($F_{REF\_CLK}$) and the PLL output clock is maintaining a predetermined phase angle relative to that of the reference clock (typically zero). Depending upon the type of PLL, calibration is typically accomplished by searching through frequency bands until a frequency band is found that includes the frequency of the reference clock signal. Searching for the calibration band takes a finite amount of time. The calibration time impacts the overall time to initialize the system relying on the PLL. Calibration time for finding the calibration frequency band for the PLL is an important attribute of a PLL.

One prior art method of calibration uses a binary search algorithm to identify the calibration band. The prior art calibration process iteratively selects a candidate band for PLL operation. Each iteration typically eliminates half of the remaining bands as candidates for the calibration band. Given B frequency bands to search, a binary search algorithm can identify the calibration band with a worst case number of guesses on the order of $\log_2(B)$ guesses, i.e., $O(\log_2(B))$. Due to the number of reference clock cycles required to accumulate a meaningful difference between the frequency of the reference clock signal and the frequency of the output clock signal this amount of time may be too long for some applications.

SUMMARY

An integrated circuit apparatus for calibrating a phase locked loop (PLL) circuit that includes a phase comparator configured to receive a reference clock signal and a feedback clock signal and generate a phase error signal, a variable frequency oscillator configured for receiving the phase error signal and generating a corresponding fast clock signal at an output of the variable frequency oscillator, and a divider that is configured to divide the fast clock signal by a divisor (N) so as to generate the feedback clock signal, includes a calibration circuit. The calibration circuit is coupled to receive the reference clock signal and the fast clock signal and to provide a frequency band selection signal to the variable frequency oscillator. The calibration circuit includes a counting circuit operable for counting a number of cycles of the fast clock signal over a period of time defined by a number of cycles (M) of the reference clock signal. The calibration circuit also includes a selection block operable for performing a convergence test using the counted number of fast clock cycles, N, and M, wherein the selection block generates the frequency band selection signal in accordance with the results of the convergence test to select a next candidate calibrated frequency band.

By using a convergence test based upon the count of cycles of the fast clock signal and N, the calibration circuitry can converge on the calibrated frequency band in fewer reference clock cycles per iteration than required with a convergence test based upon the count of cycles of the output clock or feedback signal.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
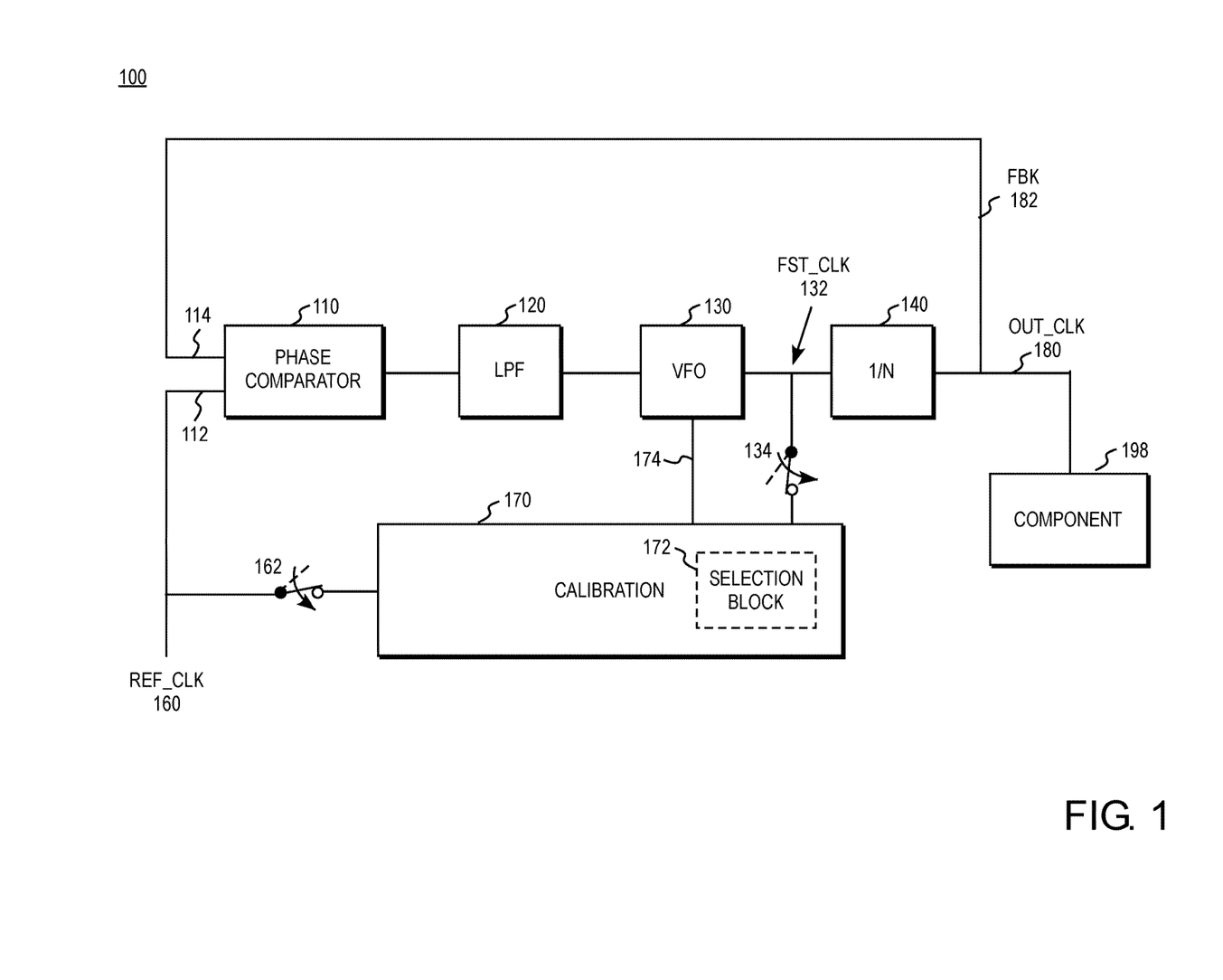
FIG. 1 illustrates a functional block diagram of a phase locked loop circuit.

FIG. 1 illustrates one embodiment of a PLL circuit 100. The reference clock 160 (REF_CLK) is provided to the reference clock input 112 of a phase comparator 110. A feedback loop (FBK) 182 couples the PLL clock output 180 (OUT_CLK) to a feedback input 114 of the phase comparator. The phase comparator generates a phase error signal corresponding to a phase error between REF_CLK and OUT_CLK. The phase error signal is filtered by a low pass filter (LPF) 120. The filtered phase error signal controls a variable frequency oscillator (VFO) 130. The frequency and phase of the VFO varies in response to the filtered phase error signal. The output of the VFO is identified as fast clock signal 132 (FST_CLK). The fast clock signal is divided by divide-by-N divider 140 to provide the output clock signal, OUT_CLK, as well as the feedback signal FBK 182. The VFO is driven to cause the PLL clock output to match the phase and frequency of the reference clock. Although only the monitored output clock signal 180 is shown (i.e., the output used for feedback), the PLL may drive multiple outputs.

Calibration circuitry 170 is used to identify the calibration band for the PLL. In one embodiment, the calibration circuitry may be electrically de-coupled from the PLL via switches 162, 134 when the PLL is not being calibrated. While in a calibration mode, however, the calibration circuitry receives REF_CLK 160 and FST_CLK 132 as inputs and provides a control signal 174 to the VFO.

The calibration circuitry relies on a search algorithm to locate a range or band of frequencies to which the PLL should be set to initially operate within. This band is referred to as the calibration band. Once the correct range of frequencies is located, the remainder of the PLL circuit should be able to lock to and follow the reference clock. The calibration circuitry incorporates a selection block 172 that performs a convergence test to facilitate identifying the calibration band out of a plurality of possible bands. In one embodiment, the convergence test is iteratively applied to a candidate band of the remaining untested bands to eliminate approximately one-half of the remaining bands with each iteration.

Figure 2:
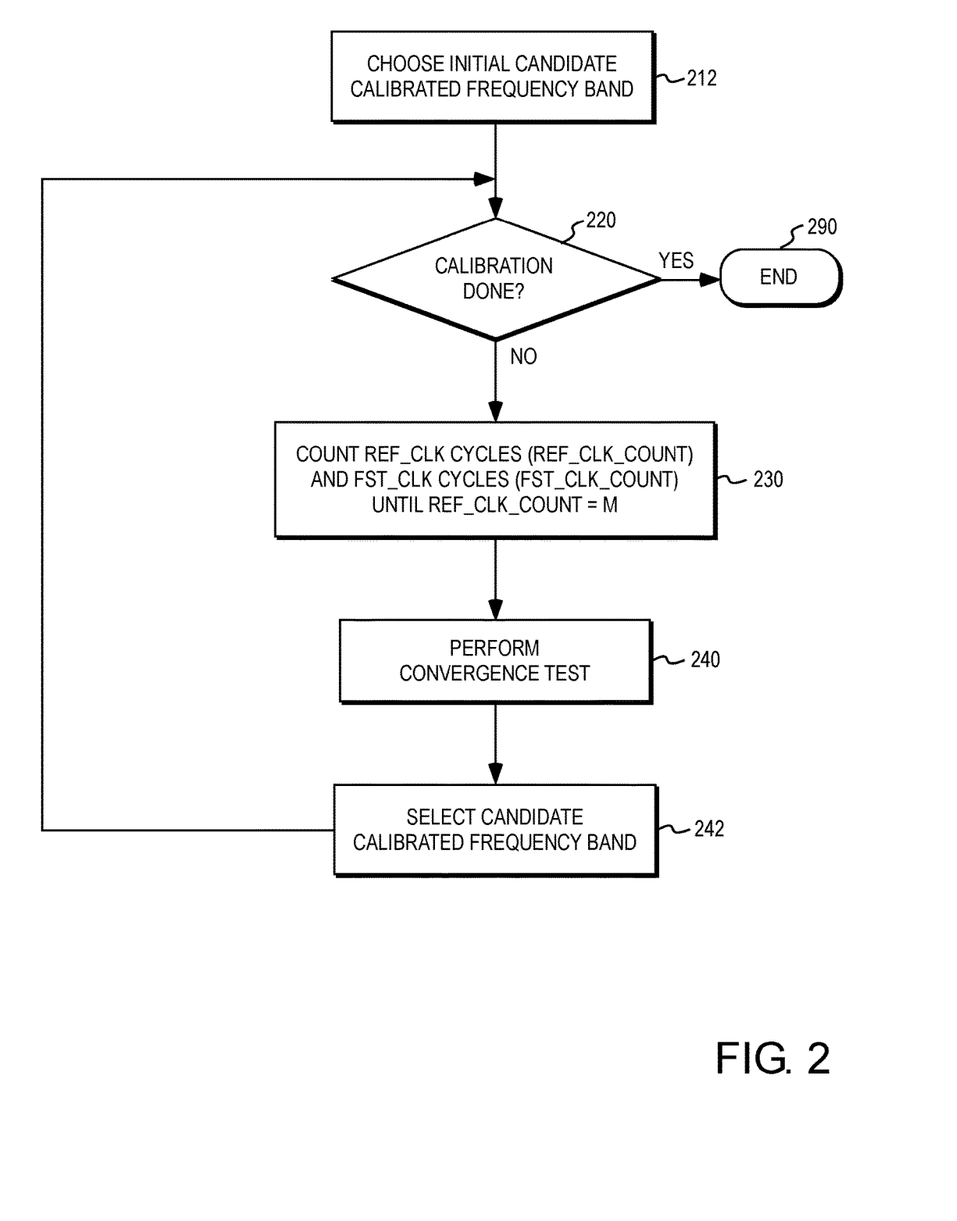
FIG. 2 illustrates a method of calibrating a phase locked loop circuit.

FIG. 2 illustrates one embodiment of a process of finding the calibration frequency band from a plurality (B) of frequency bands. Initially, all bands within the set of B bands are candidates for the calibration frequency band. For purposes of FIG. 2, the set of B bands is ordered (increasing or decreasing) and each band is identified by an index. The calibration process iteratively eliminates candidate bands from the set based upon information collected during each iteration with a selected frequency band.

An initial candidate calibrated frequency band is selected in step 212 from a set (plurality) of B frequency bands as the band to test. In step 220 an iteration test is performed to determine if the halt condition for the calibration process has been reached, i.e. whether the calibration process is completed. If no further iterations are to take place, the process ends with step 290. Otherwise the process starts an iteration of the selection process.

In step 230, the number of reference clock cycles (REF_CLK_COUNT) and fast clock cycles (FST_CLK_COUNT) are counted until the count of REF_CLK cycles reaches a pre-determined value, M.

A convergence test is performed in step 240. The convergence test determines which of the candidate bands out of the remaining bands being considered should be discarded from consideration for the next round of iteration testing. Each iteration eliminates approximately one half of the remaining bands from consideration. The process is a binary search process which is also known as a half-interval search.

The process relies on a convergence test using the number of reference clock cycles (REF_CLK_COUNT) and the number of fast clock cycles (FST_CLK_COUNT) for each iteration. In other words, the test used for convergence to a final calibration band is a function of FST_CLK_COUNT and REF_CLK_COUNT. The nomenclature used to denote this test is as follows:

$f(FST\_CLK\_COUNT, REF\_CLK\_COUNT)$

The REF_CLK_COUNT may be set to a pre-determined value, M, such that the test function can be expressed as $f(FST\_CLK\_COUNT, M)$ where M corresponds to the number of reference clock cycles used for a given binary search algorithm test iteration. In one embodiment, the convergence test is a function $f(FST\_CLK\_COUNT, N \cdot M)$, where N is the divider ratio and $N \cdot M$ is the product of N and M. For a constant M and N, a convergence test expressed as $f(FST\_CLK\_COUNT)$ inherently includes formulaic expressions involving constants as part of the formulation.

In various embodiments, the convergence test is expressed as an inequality between FST_CLK_COUNT and $N \cdot M$, a difference between FST_CLK_COUNT and $N \cdot M$, or an inequality between a difference between FST_CLK_COUNT and $N \cdot M$ with another value such as zero.

Step 242 selects the next candidate calibrated frequency band based upon the results of the convergence test. The process then returns to step 220 to determine whether the calibration process is complete. The last candidate calibrated frequency band becomes the calibrated frequency band.

Figure 3:
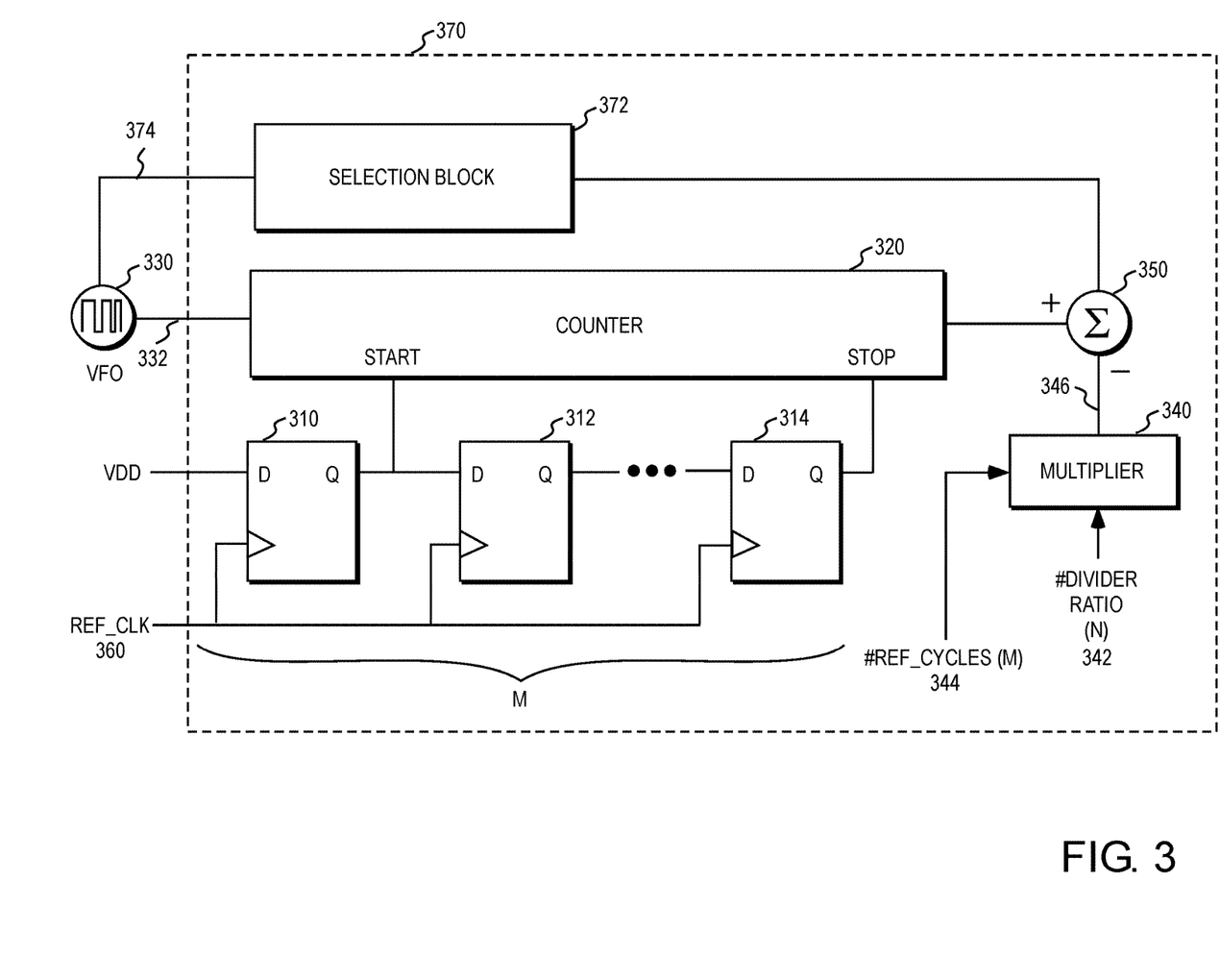
FIG. 3 illustrates a calibration circuit for a phase locked loop circuit.

FIG. 3 illustrates one embodiment of circuitry for performing the convergence test. The calibration circuit includes a counter 320. The counter is coupled to receive the FST_CLK 332 signal from VFO 330.

A plurality (M) of D flip-flops determines the number of reference clock cycles used for each decision cycle of the search block 370. A state change from low to high of REF_CLK 360 will trigger a change in the output of D flip-flop 310 which will cause counter 320 to begin counting the number of cycles of FST_CLK. The change in the output of D-flip flop 310 will synchronously (with REF_CLK) cascade to D flip-flop 312 and to each successive D flip-flop. A change in the state of the Mth D flip-flop 314 stops counter 320. The counter and flip-flops co-operate to collect the count of FST_CLK cycles (i.e., FST_CLK_COUNT) which occurs within a pre-determined number (M) of REF_CLK cycles (i.e., REF_CLK_COUNT). In one embodiment, M is selected to be an integer power of 2.

In one embodiment, M is selectable. A multiplexer may be used, for example, to select from a plurality of pre-determined index of D flip-flops as the stop input to counter 320. For example, a multiplexer may be used to select the output of the 256th, 512th, 1024th, or 2048th D flip-flop as the stop input to counter 320.

The counter output (i.e., FST_CLK_COUNT) is provided to a summer 350. The summer also receives a value corresponding to the product 346 of REF_CLK_COUNT (i.e., M) 344 and N 342 where N corresponds to the divide ratio from the divider 140. The product 346 of M and N is provided by multiplier 340. In one embodiment N is an integer power of 2. In one embodiment at least one of N and M is a integer power of 2. The use of an integer power of 2 for one of N or M enables the use of a shift register as a multiplier. In one embodiment multiplier 340 is a shift register.

The output of summer 350 is provided to selection block 372. Selection block 372 relies upon a convergence test which is a function of FST_CLK_COUNT and REF_CLK_COUNT, i.e., $f(FST\_CLK\_COUNT, REF\_CLK\_COUNT)$. The convergence test may apply an inequality test between FST_CLK_COUNT and REF_CLK_COUNT, for example. In this case, given that REF_CLK_COUNT=M, the value FST_CLK_COUNT−N·M is computed and provided to selection block 372. For an inequality test, the value indicates which of FST_CLK_COUNT and N·M is larger than the other (or equal). The selection block can thus determine which bands to eliminate or alternatively which band to select for the next iteration of the selection process. Selection block 372 outputs a frequency band selection signal 374 to the VFO to select the next candidate calibration frequency band based on the results of the convergence test. In one embodiment, signal 374 includes a digital code for selecting the frequency band. The digital code value is latched into the VFO. This process repeats until the selection block has selected a frequency band or determined no band qualifies for selection. If one of the frequency bands qualifies for selection as the calibration frequency band, the last candidate calibration frequency band becomes the calibration frequency band.

Figure 4:
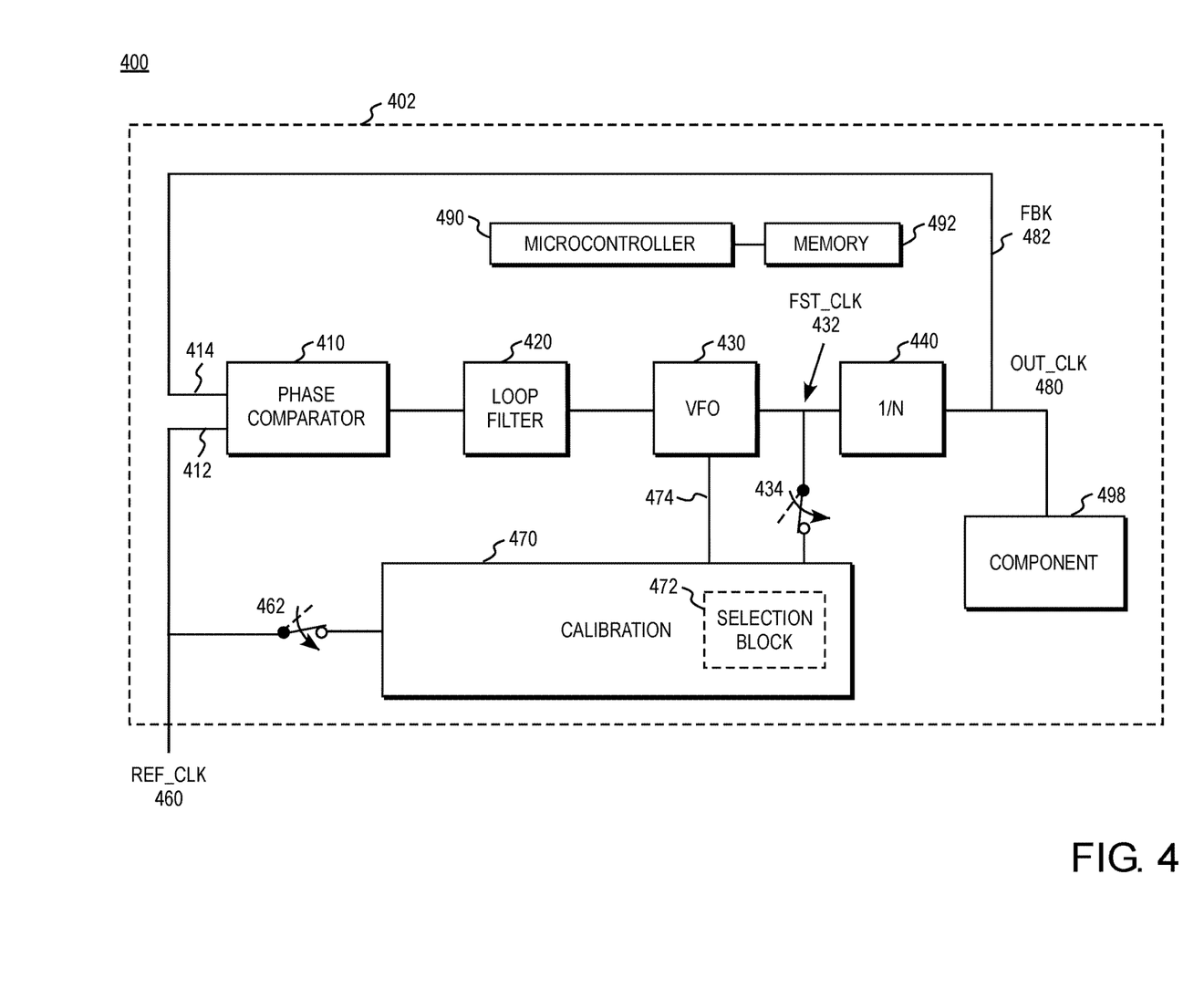
FIG. 4 illustrates one embodiment of a phase locked loop circuit including calibration circuitry.

FIG. 4 illustrates one embodiment of a phase locked loop circuit 400 including calibration circuitry 470. The reference clock 460 is provided to the reference clock input 412 of phase comparator 410. The PLL clock output signal (OUT_

CLK 480) is derived by applying divider 440 to divide down the output (FST_CLK 432) of the variable frequency oscillator, VFO 430.

A feedback loop 482 couples the PLL clock output to a feedback input 414 of the phase comparator 410. The phase comparator generates a signal corresponding to a phase error signal which is filtered by loop filter 420. The filtered phase error signal controls the frequency of VFO 430. The frequency and phase of the VFO vary in response to the filtered phase error signal. The VFO is driven to cause the PLL clock output (OUT_CLK 480) to match the phase and frequency of the reference clock REF_CLK 460. Although only the monitored output 480 is shown, the PLL may drive multiple outputs.

In one embodiment, the calibration circuitry 470 is selectively coupled to the remainder of the PLL circuitry via switches 462, 434. The switch positions illustrated are the positions effective during the calibration process. Outside of the calibration mode the switches may be toggled open to electrically de-couple the calibration circuitry from the remainder of the PLL circuitry.

The selection block 472 of the calibration circuitry performs a convergence test that is a function of FST_CLK_COUNT and REF_CLK_COUNT. In particular, the convergence test compares FST_CLK_COUNT with N·M, where N is the divider ratio for divider 440 and M is the number of reference clock cycles used in an iteration of the search process. Based upon the result of this comparison, the selection block provides a frequency band selection signal 474 which is latched into the VFO. The frequency band selection signal selects a candidate calibrated frequency band for each iteration of the search process. At the conclusion of the search the last candidate calibrated frequency band becomes the calibrated frequency band.

In one embodiment, the phase locked loop circuitry with calibration circuitry is fabricated on a semiconductor substrate 402 for incorporation into an integrated circuit package. In one embodiment, the integrated circuit package includes a microcontroller 490 and memory 492 to facilitate programmatic control of the calibration. Circuitry connecting the microcontroller to other elements is not expressly illustrated.

"Programmable" or "programmatic control" means that the variables such as number of frequency bands, divider ratio, and other variables can be programmatically set and varied and that the values are not permanently fixed at the time of manufacture. This may be accomplished by storing the values in a register, memory, or other storage location from which the values can be retrieved. In one embodiment, the values are stored in volatile memory. In an alternative embodiment, the values are stored in a non-volatile memory in order to preserve the values across power-down cycles of the apparatus.

Figure 5:
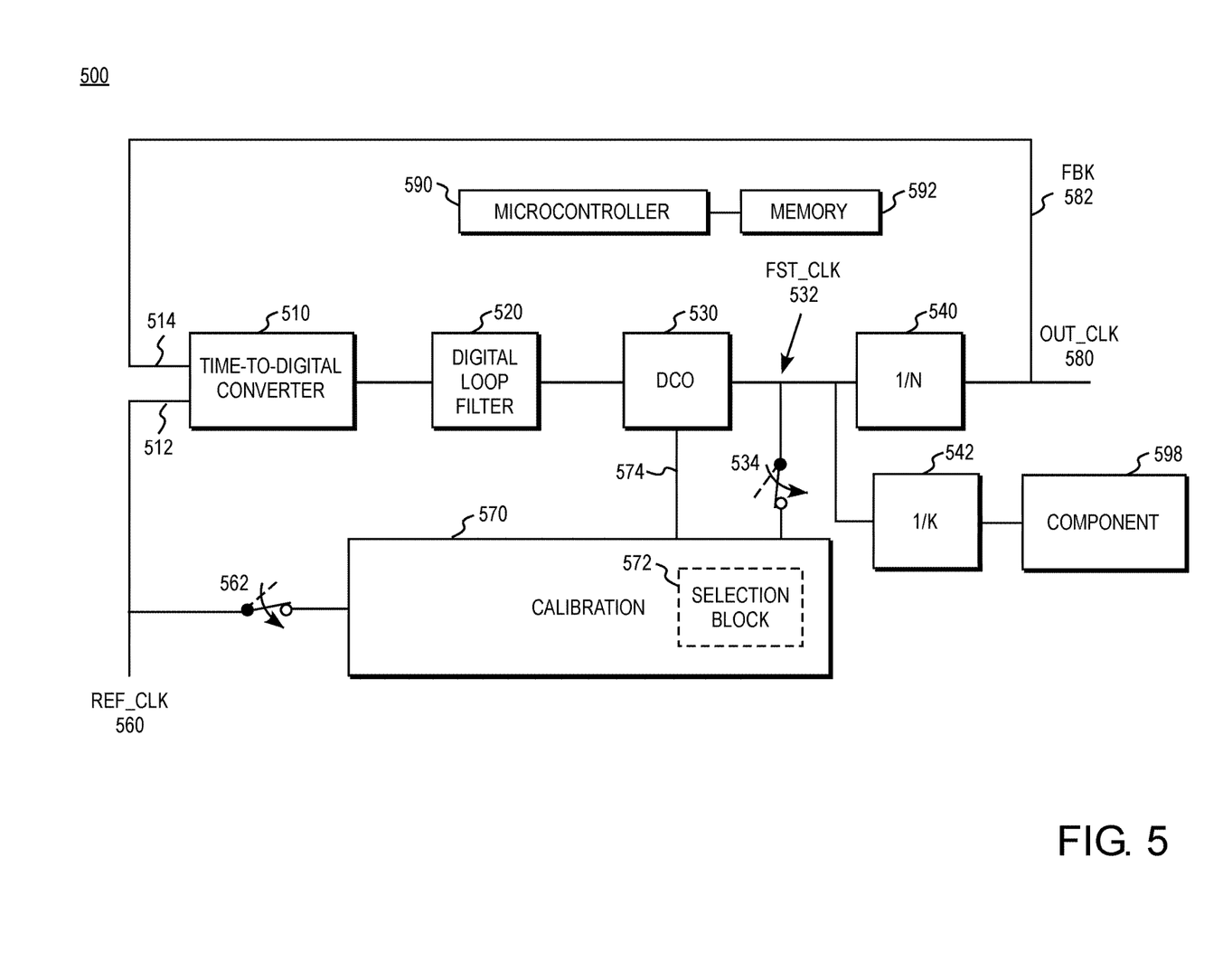
FIG. 5 illustrates another embodiment of a digital phase locked loop circuit including calibration circuitry.

FIG. 5 illustrates one embodiment of a digital phase locked loop circuit 500 including calibration circuitry 570. The reference clock signal 560 is provided to the reference clock input 512 of time-to-digital converter 510. The PLL clock output (output clock signal OUT_CLK 580), is derived by applying divider 540 to divide down the output (fast clock signal FST_CLK 532) of a digitally controlled oscillator, DCO 530.

A feedback loop 582 couples the PLL clock output to a feedback input 514 of the time-to-digital converter 510. The time-to-digital converter generates a signal corresponding to a phase error signal which is filtered by digital loop filter 520. The filtered phase error signal controls the frequency of DCO 530. The frequency and phase of the DCO vary in response to the filtered phase error signal. The DCO is driven to cause the PLL clock output (OUT_CLK 580) to match the phase and frequency of the reference clock REF_CLK 560. Although only the monitored output 580 is shown, the PLL may drive multiple outputs.

In one embodiment, the calibration circuitry 570 is selectively coupled to the remainder of the PLL circuitry via switches 562, 534. The switch positions illustrated are the positions effective during the calibration process. Outside of the calibration process the switches may be toggled open to electrically de-couple the calibration circuitry from the reference clock and the output clock of the PLL circuitry.

The selection block 572 of the calibration circuitry utilizes a convergence test that is a function of FST_CLK_COUNT and REF_CLK_COUNT. In particular, the convergence test compares FST_CLK_COUNT with the product of N and M (i.e., N·M), where N is the divider ratio for divider 540 and M is the number of reference clock cycles used in an iteration of the search process. Based upon the result of this comparison, the selection block provides a frequency band selection signal 574 that is latched into the DCO. The frequency band selection signal selects a candidate calibrated frequency band for each iteration of the search process. At the conclusion of the search the last candidate calibrated frequency band becomes the calibrated frequency band.

The embodiment of FIG. 5 utilize the first divider 540 to generate the output clock signal 580. The output of the first divider 540 is also the monitored output used for providing the feedback signal FBK 582 for the PLL. The PLL will function during normal operation to cause the frequency and phase of OUT_CLK 580 to track the frequency and phase of REF_CLK 560.

A second divider 542 having a divide ratio K is coupled to provide a second output clock signal that is 1/K the frequency of the FST_CLK 532 signal. K may be selected such that K=N in some embodiments in order to provide a clock signal with the same frequency as REF_CLK 560 to a component 598. In alternative embodiments, K is selected such that K≠N. If K<N then the clock signal provided to component 598 will be higher in frequency than REF_CLK. If K>N then the clock signal provided to component 598 will be lower in frequency than REF_CLK. Generally, the frequency of the clock signal provided to component 598 may be expressed as $N/K \cdot F_{REF\_CLK}$.

Thus through appropriate selection of N and K, the frequency of the clock signal to component 598 may be scaled as desired relative to $F_{REF\_CLK}$. For example, N and K may be chosen such that the clock signal to component 598 has a frequency that is: a multiple (e.g., 4), a fraction (e.g., ⅔), or other non-integer scale (e.g., ⅝) of $F_{REF\_CLK}$.

In one embodiment, the phase locked loop circuitry with calibration circuitry is fabricated on a semiconductor substrate for incorporation into an integrated circuit package. In one embodiment, the integrated circuit package includes a microcontroller 590 and memory 592 to facilitate programmatic control of the calibration. Circuitry connecting the microcontroller to other elements is not expressly illustrated.

Figure 6:
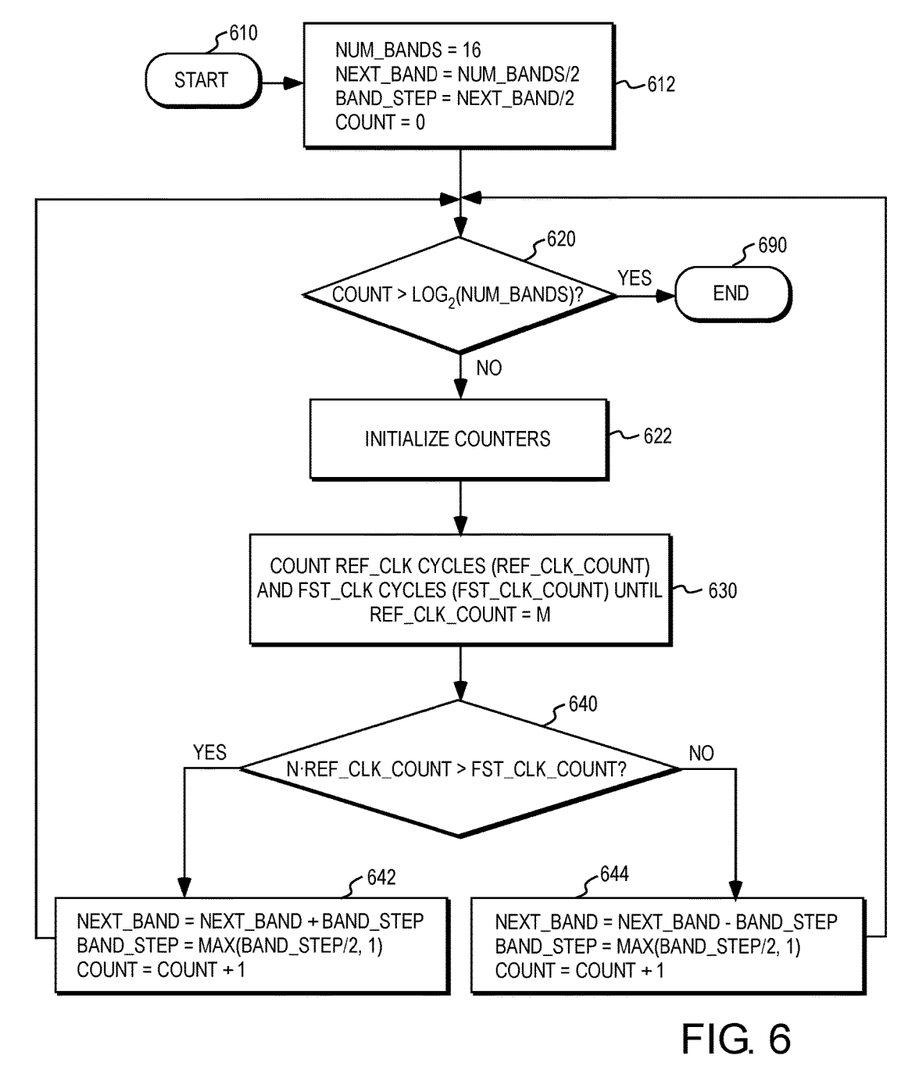
FIG. 6 illustrates one embodiment of a method of calibrating a phase locked loop circuit.

FIG. 6 illustrates one embodiment of a method of calibrating a PLL. The process of FIG. 6 relies on a number of variables or constants defined as follows:

Band step (BAND_STEP)=a numerical value used to calculate NEXT_BAND and to determine whether calibration should be terminated.

N=divider ratio

Next band (NEXT_BAND)=an index that indicates the next frequency band to test (may be a numerical value).

Number of bands (NUM_BANDS)=the number of frequency bands the tuning range of the PLL has been divided into. Each frequency band has an associated index by which it can be referenced.

Fast clock count (FST_CLK_COUNT)=the number of fast clock cycles that occur during a pre-determined number of reference clock cycles.

Reference clock count (REF_CLK_COUNT)=the number of reference clock cycles utilized for testing a selected frequency band. In this case, the number is determined up front as M.

After starting in step 610, the BAND_STEP, NEXT_BAND, and COUNT variables are initialized in block 612. The process of FIG. 6 assumes the number of bands will be selected as an integer power of 2. In step 620, an iteration test is performed to determine if the halt condition for the calibration process has been reached.

This particular embodiment is one implementation of a binary search process. The maximum number of iterations is based upon the number of frequency bands. Thus if the iteration COUNT exceeds $LOG_2$(NUM_BANDS) the process is terminated in step 690.

In step 622, the counters are initialized. In this case, REF_CLK_COUNT and FST_CLK_COUNT variables are initialized to zero. In step 630, the number of REF_CLK cycles and FST_CLK cycles are counted until the count of REF_CLK cycles reaches a pre-determined value, M. Step 622 need not be a separate step from 630. Typically, a "start counter" trigger may also be used to reset the counter. As indicated in FIG. 3, the REF_CLK_COUNT may be determined by means other than a counter.

In step 640, a convergence test is performed. If N·REF_CLK_COUNT exceeds FST_CLK_COUNT, then a higher frequency band (i.e., faster frequencies) is selected for the next band. Accordingly, the process continues with step 642. Otherwise a lower frequency band is chosen and the process continues with step 644. Steps 642, 644 set NEXT_BAND accordingly. BAND_STEP is halved so long as the result is not less than one and the iteration count is incremented. The process then returns to step 620 to determine if the process should terminate or proceed with another iteration.

The process of FIG. 6 illustrates one implementation of a search process, however, other search processes (e.g., binary) and methods of implementing a search process may be used. Different methods may be used, for example, depending upon speed, memory, or hardware constraints imposed on implementation of the search process. Although formulaic expressions have been provided to aid in understanding one embodiment of a search process, the formulaic expressions may be replaced with numbers where the designer knows parameter values (e.g., the designer may replace the $LOG_2$(NUM_BANDS) function in step 620 with a numerical value) or with a series of conditionals (e.g., replacing the "MAX" function in steps 642, 644.

The convergence test is a function of FST_CLK_COUNT and REF_CLK_COUNT. In particular, the convergence test is a function of FST_CLK_COUNT and N·REF_CLK_COUNT. The REF_CLK_COUNT may be set to a pre-determined value, M, such that the test function may be expressed as $f$(FST_CLK_COUNT, N·M) or more simply $f$(FST_CLK_COUNT) given that N·M is a constant. By using a convergence test based upon the count of cycles of the fast clock signal and N, the calibration circuitry can converge on the calibration frequency band in fewer reference clock cycles per iteration than required with a convergence test based upon the count of cycles of the output clock. The use of FST_CLK_COUNT rather than OUT_CLK_COUNT enables the use of fewer reference clock cycles per iteration than required when using OUT_CLK_COUNT.

In summary an apparatus includes phase locked loop circuitry for generating an output clock corresponding to a reference clock. The phase locked loop circuitry includes a variable frequency oscillator generating a fast clock and a divider coupled to generate the output clock as 1/N of the fast clock. Calibration circuitry for selecting a calibrated frequency band for the variable frequency oscillator from a plurality (B) of candidate bands iteratively eliminates candidate bands as the calibrated band by performing a convergence test. The convergence test for a given iteration is a function of a count of cycles of the fast clock (FST_CLK_COUNT) occurring during a pre-determined number (M) of cycles of the reference clock.

In the preceding detailed description, the invention is described with reference to specific exemplary embodiments thereof. Various modifications and changes may be made thereto without departing from the broader scope of the invention as set forth in the claims. The specification and drawings are, accordingly, to be regarded in an illustrative rather than a restrictive sense.

What is claimed is:

1. An integrated circuit apparatus for calibrating a phase locked loop (PLL) circuit that includes a phase comparator configured to receive a reference clock signal and a feedback clock signal and generate a phase error signal, a variable frequency oscillator configured for receiving the phase error signal and generating a corresponding fast clock signal at an output of the variable frequency oscillator, and a divider that is configured to divide the fast clock signal by a divisor (N) so as to generate the feedback clock signal, the integrated circuit device comprising:
a calibration circuit coupled to receive the reference clock signal and the fast clock signal and to provide a frequency band selection signal to the variable frequency oscillator, the calibration circuit including:
a counting circuit operable for counting a number of cycles of the fast clock signal over a period of time defined by a number of cycles (M) of the reference clock signal; and
a selection block operable for performing a convergence test using the counted number of fast clock cycles, N, and M, wherein the selection block generates the frequency band selection signal in accordance with the results of the convergence test to select a next candidate calibrated frequency band.

2. The apparatus of claim 1 wherein M is an integer power of 2.

3. The apparatus of claim 1 wherein the convergence test computes a difference between the counted number of fast clock cycles and N·M.

4. The apparatus of claim 3 wherein the convergence test is an inequality test between the counted number of fast clock cycles and N·M.

5. The apparatus of claim 3 wherein the convergence test circuit further comprises a shift register for computing the product of N and M.

6. The apparatus of claim 1 wherein the calibration circuit executes a binary search to select the calibrated frequency band.

7. The apparatus of claim 1 wherein the variable frequency oscillator is a digitally controlled oscillator.

8. A method for calibrating a phase locked loop (PLL) circuit that includes a phase comparator configured to receive a reference clock signal and a feedback clock signal and generate a phase error signal, a variable frequency oscillator configured for receiving the phase error signal and generating a corresponding fast clock signal at an output of the variable frequency oscillator, and a first divider that is configured to divide the fast clock signal by a divisor (N) so as to generate the feedback clock signal, the method comprising:

coupling a calibration circuit to the reference clock signal input, the input of the variable frequency oscillator and to the output of the variable frequency oscillator;

selecting a frequency band of a plurality of frequency bands as a candidate calibration frequency band;

counting the number of cycles of the fast clock signal over a period of time defined by a number of the reference clock cycles (M); and performing a convergence test using the counted number of fast clock cycles, N, and M;

selecting another frequency band of the plurality of frequency bands as the candidate calibration frequency band in accordance with the results of the convergence test; and continuing the counting, the performing and the selecting another frequency band for a plurality of iterations to identify a last candidate calibration frequency band for the phase locked loop circuit.

9. The method of claim 8 wherein the performing a convergence test computes a difference between the counted number of fast clock cycles and N·M.

10. The method of claim 9 wherein the performing a convergence test performs an inequality test between the counted number of fast clock cycles and N·M.

11. The method of claim 8 wherein the performing a convergence test is a function of the counted number of fast clock cycles and N·M, wherein M is an integer power of 2 and further wherein N·M is computed using a shift register.

12. The method of claim 8 further comprising:

initiating normal operation of the PLL circuit, the variable frequency oscillator configured to operate using the last candidate calibration frequency band as the calibrated frequency band.

13. The method of claim 12 further comprising:

decoupling the calibration circuit from the reference clock signal input and the output of the variable frequency oscillator.

14. The method of claim 8 wherein the PLL comprises a second divider configured to divide the fast clock signal by a divisor (K) wherein K # N.

15. An integrated circuit apparatus for calibrating a phase locked loop (PLL) circuit that includes a phase comparator configured to receive a reference clock signal and a feedback clock signal and generate a phase error signal, a variable frequency oscillator configured for receiving the phase error signal and generating a corresponding fast clock signal at an output of the variable frequency oscillator, a first divider that is configured to divide the fast clock signal by a divisor (N) so as to generate the feedback clock signal, and a second divider configured to divide the fast clock signal by a divisor (K) wherein K≠N, the integrated circuit device comprising:

a calibration circuit coupled to receive the reference clock signal and the fast clock signal and to provide a frequency band selection signal to the variable frequency oscillator, the calibration circuit including:

a counting circuit operable for counting a number of cycles of the fast clock signal over a period of time defined by a number of cycles (M) of the reference clock signal; and a selection block operable for performing a convergence test using the counted number of fast clock cycles, N, and M, wherein the selection block generates the frequency band selection signal in accordance with the results of the convergence test to select a next candidate calibrated frequency band.

16. The apparatus of claim 15 wherein N is an integer power of 2.

17. The apparatus of claim 15 wherein the convergence test computes a difference between the counted number of fast clock cycles and N·M.

18. The apparatus of claim 15 wherein the convergence test is an inequality test between the counted number of fast clock cycles and N·M.

19. The apparatus of claim 17 further comprising a shift register for computing N·M.

20. The apparatus of claim 15 wherein the calibration circuitry executes a binary search to select the calibrated frequency band.

21. The apparatus of claim 15 wherein the variable frequency oscillator is a digitally controlled oscillator.

* * * * *

UNITED STATES PATENT AND TRADEMARK OFFICE
CERTIFICATE OF CORRECTION

PATENT NO. : 9,654,121 B1  
APPLICATION NO. : 15/169997  
DATED : May 16, 2017  
INVENTOR(S) : Min Chu

Page 1 of 1

It is certified that error appears in the above-identified patent and that said Letters Patent is hereby corrected as shown below:

Claim 14, Line 3: "$K \neq N$" should read --$K = N$--

Signed and Sealed this  
Twenty-fourth Day of July, 2018

Andrei Iancu  
*Director of the United States Patent and Trademark Office*